United States Patent
Tamura et al.

(10) Patent No.: US 6,811,816 B2
(45) Date of Patent: Nov. 2, 2004

(54) METHOD AND APPARATUS FOR FORMING DEPOSITION FILM, AND METHOD FOR TREATING SUBSTRATE

(75) Inventors: Hideo Tamura, Nara (JP); Masahiro Kanai, Tokyo (JP); Yasuyoshi Takai, Nara (JP); Hiroshi Shimoda, Nara (JP); Hidetoshi Tsuzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 176 days.

(21) Appl. No.: 10/195,543

(22) Filed: Jul. 16, 2002

(65) Prior Publication Data

US 2003/0010623 A1 Jan. 16, 2003

Related U.S. Application Data

(62) Division of application No. 09/844,071, filed on Apr. 30, 2001, now Pat. No. 6,562,400.

(30) Foreign Application Priority Data

May 1, 2000 (JP) .................................... 2000-131900
Apr. 27, 2001 (JP) .................................... 2001-131533

(51) Int. Cl.⁷ .................................................. C23C 16/00
(52) U.S. Cl. .................................... 427/248.1; 427/445
(58) Field of Search ......................... 427/248.1, 445

(56) References Cited

U.S. PATENT DOCUMENTS

| | | | |
|---|---|---|---|
| 4,400,409 A | 8/1983 | Izu et al. ................... 427/39 |
| 4,485,125 A | 11/1984 | Izu et al. ................... 427/74 |
| 4,492,181 A | 1/1985 | Ovshinsky et al. ........ 119/718 |
| 5,192,717 A | 3/1993 | Kawakami et al. ........ 439/233 |
| 5,575,855 A | 11/1996 | Kanai et al. .............. 118/718 |
| 5,589,007 A | 12/1996 | Fujioka et al. ............ 136/249 |
| 5,720,826 A | 2/1998 | Hayashi et al. ........... 136/249 |
| 5,721,019 A * | 2/1998 | Ashcraft et al. .......... 427/425 |
| 6,031,198 A | 2/2000 | Moriyama et al. ..... 219/121.57 |
| 6,153,013 A | 11/2000 | Sakai et al. .............. 118/719 |
| 6,162,988 A | 12/2000 | Okabe et al. ............. 136/258 |
| 6,338,872 B1 | 1/2002 | Yoshino et al. ........ 427/248.1 |
| 6,350,489 B1 | 2/2002 | Moriyama et al. ...... 427/255.5 |
| 6,397,775 B1 | 6/2002 | Sano et al. .............. 118/723 |

FOREIGN PATENT DOCUMENTS

| | | | |
|---|---|---|---|
| JP | 58182220 | 10/1983 | ........... C23C/13/02 |
| JP | 9-2032533 | 5/1992 | |

* cited by examiner

*Primary Examiner*—Steven VerSteeg
(74) *Attorney, Agent, or Firm*—Fitzpatrick, Cella, Harper & Scinto

(57) ABSTRACT

A gas adsorptive member is disposed in a space communicating with film deposition chambers, and deposition films are deposited while continuously feeding gas components released from this member, thereby enabling the high quality and uniform deposition films to be formed on the substrate with good reproducibility.

2 Claims, 5 Drawing Sheets

METHOD AND APPARATUS FOR FORMING DEPOSITION FILM, AND METHOD FOR TREATING SUBSTRATE

This application is a division of application Ser. No. 09/844,071, filed Apr. 30, 2001 which has issued as U.S. Pat. No. 6,562,400 on May 13, 2003.

BACKGROUND OF THE INVENTION

1. Field of the Invention

The present invention relates to a method and apparatus for forming a deposition film, particularly to a method and apparatus for forming a thin film to be used for a laminated thin film element such as a photovoltaic element on a substrate.

2. Description of the Related Art

For continuously forming deposition films to be used for a photovoltaic element and the like on a substrate, independent deposition chambers for forming each semiconductor layer have been provided to deposit each semiconductor layer in respective deposition chambers. For example, U.S. Pat. No. 4,400,409 discloses in its specification a continuous plasma CVD apparatus using a roll-to-roll method. This apparatus comprises plural glow discharge areas in which a sufficiently long and flexible substrate having a desired width is disposed along a passageway on which the substrate sequentially penetrates each glow discharge area. Using this apparatus, elements having semiconductor joints can be continuously formed by continuously conveying the substrate along its longitudinal direction while depositing a semiconductor layer of a desired conduction type in each glow discharge area. According to the specification described above, a gas gate is used for preventing diffusion and mingling of a dopant gas used for depositing each semiconductor layer into the other glow discharge areas. Practically, the glow discharge areas are isolated with each other using slits of separation passageways, and a flow of a sweeping gas such as Ar and $H_2$ is created in this separation passageway.

Japanese Patent Publication No. 4-32533 discloses, on the other hand, in its specification a method using a surface protection sheet for protecting the surface of a ribbon shaped substrate in the roll-to-roll apparatus.

An example of a sputtering apparatus is described below with reference to drawings.

FIG. 3 shows an example of the sputtering apparatus, in which a reel-off vacuum chamber 101, a film deposition vacuum chamber 201 and a reel-up vacuum chamber 301 are connected with each other with gas gates 151 and 152, and the chambers are evacuated with a vacuum pump (not shown) connected to evacuation ports 102, 202 and 302.

A ribbon shaped substrate 10 is wound on a reel-off bobbin 111, and is conveyed toward the film deposition vacuum chamber 201 with its convey direction changed by a convey roller 112 (the direction denoted by an arrow A in the drawing).

The ribbon shaped substrate 10 is heated to a prescribed film deposition temperature with a lamp heater 203 in the film deposition vacuum chamber 201, and films are deposited on the ribbon shaped substrate 10 in film deposition chambers 204 and 206 using various kinds of targets 205 and 207. The ribbon shaped substrate 10 is reeled up with a reel-up bobbin 311 in the reel-up vacuum chamber 301 with its convey direction changed by a convey roller 312. During this reel-up procedure, a surface protection sheet 313 for protecting the surface of the ribbon shaped substrate 10 is fed from a reel-off core 314 and is reeled up on the bobbin 311 together with the ribbon shaped substrate 10.

A sweeping gas flows through the gas gates 151 and 251 by means of gas feed pipes 152, 153, 252 and 253 to prevent the gases from being mixed in each vacuum camber. The surface protection sheet 313 is provided in order to protect the surface of the ribbon shaped substrate 10 when it is reeled up on the bobbin. A sheet made of any materials may be used so long as it exhibits desired functions. Examples of the surface protection sheet available include fibrous sheets of paper and cloth, resin sheets such as polyethylene, polyester, PET, polyimide and polyamide sheets, and a sheet manufactured by coating a metal on one or both faces thereof.

For further improving photovoltaic conversion efficiency as a photovoltaic element, it is necessary to improve characteristics of a semiconductor film that absorbs a light and converts it into electricity, as well as characteristics of a back reflector film provided for reflecting a light. While this back reflector film is manufactured using conventional sputtering apparatus, the film is desirably formed with high quality and uniformity with good reproducibility.

SUMMARY OF THE INVENTION

Accordingly, it is an object of the present invention to provide a method and apparatus for forming a deposition film with higher quality, better uniformity and better reproducibility as compared with the deposition films formed by the conventional methods and apparatus.

For solving the above problems, the present inventors have completed through intensive studies the present invention having the constructions as described below.

In one aspect, the preset invention provides a method for forming a deposition film on a substrate in a film deposition chamber, wherein a gas adsorptive member is placed in a space communicating with the film deposition chamber, and the deposition film is deposited while continuously feeding a released gas component generated from the gas adsorptive member into the space. Preferably, the released gas component is fed by reeling off the gas adsorptive member.

In another aspect, the present invention provides an apparatus for forming a deposition film on a substrate in a film deposition chamber, comprising a gas adsorptive member disposed in a space communicating with a film deposition chamber, and a device for continuously feeding a released gas component generated from the member in the space. The apparatus may comprise a mechanism for reeling up a ribbon shaped gas adsorptive member on the roller. Preferably, the released gas component is continuously fed into the film deposition chamber.

In a different aspect, the present invention provides a method for treating a substrate comprising the steps of reeling off a rolled substrate in a first vacuum chamber, treating the substrate, and reeling up the substrate on a roll in a second vacuum chamber, wherein a rolled surface protection sheet is placed in the second vacuum chamber to reel up the sheet on the same axis as the axis of the rolled substrate while reeling off the sheet to release the gases from the surface of the sheet.

Further objects, featured and advantages of the present invention will become apparent from the following descriptions of the preferred embodiments with reference to the attached drawings.

DESCRIPTION OF THE PREFERRED EMBODIMENTS

The present invention will be described in more detail hereinafter with respect to examples for manufacturing a back reflector to be used for a photovoltaic element.

Figure 1:
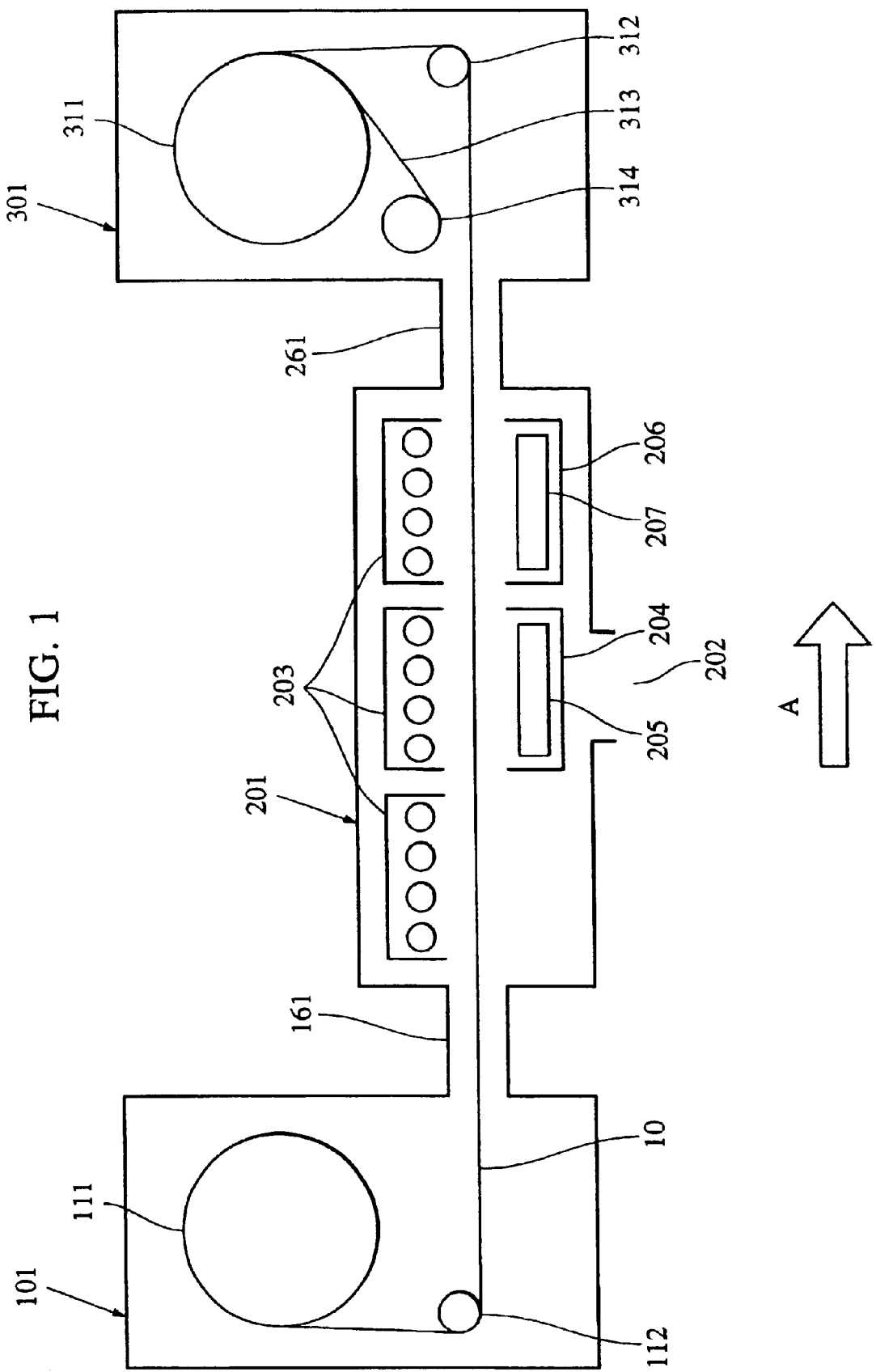
FIG. 1 is a cross section illustrating one example of the construction of an apparatus for continuously forming the deposition film according to the present invention.

FIG. 1 is a cross section illustrating one example of the construction of an apparatus for continuously forming the deposition film according to the present invention. A reel-off vacuum chamber 101, a film deposition vacuum chamber 201 and a reel-up vacuum chamber 301 are connected with vacuum chamber connecting members 161 and 261, and all the vacuum chambers are evacuated with a vacuum pump (not shown) connected to an evacuation port 202.

A ribbon shaped substrate 10 is wound on a reel-off bobbin 111, and is conveyed toward the film deposition vacuum chamber 201 with its convey direction changed with a convey roller 112 (the direction denoted by an arrow A).

Then, the ribbon shaped substrate 10 is heated at a prescribed film deposition temperature with a lamp heater 203 in the film deposition vacuum chamber 201, and films are deposited on the ribbon shaped substrate 10 in each deposition chamber 204 or 206 using various kinds of targets 205 or 207.

The ribbon shaped substrate 10 is reeled up on a reel-up bobbin 311 with its convey direction changed with a convey roller 312 in the reel-up vacuum chamber 301. A surface protection sheet 313 for protecting the surface of the ribbon shaped substrate 10 is reeled off from a reel-off core 314, and is reeled up on the bobbin 311 together with the ribbon shaped substrate 10.

The surface protection sheet 313 is provided for protecting the surface of the reeled up ribbon shaped substrate 10 while serving as a gas adsorptive member in the present invention. A gas is previously adsorbed on the gas adsorptive surface protection sheet 313 in this example. The gas adsorptive surface protection sheet 313 placed in the apparatus is reeled off from the reel-off core 314, and is reeled up on the bobbin 311 together with the ribbon shaped substrate 10 after the ribbon shaped substrate 10 has been subjected to the deposition treatment. Gas components adsorbed on the gas adsorptive surface protection sheet 313 are released while the gas adsorptive surface protection sheet is reeled off from the reel-off core 314, and are introduced into the reel-up vacuum chamber 301 and into the areas 204 and 206 where the films deposits on the ribbon shaped substrate.

Examples of the gas adsorptive surface protection sheet 313 available include conventional fibrous sheets of paper and cloth, resin sheets such as polyethylene, polyester, PET, polyimide and polyamide sheets, and a sheet manufactured by coating a metal on one or both faces thereof. Preferably, the material of the surface protection sheet at the side in contact with the treated surface of the reeled ribbon shaped substrate 10 is composed of a chemically inert material against the material constituting the treated surface.

A desirable gas may be appropriately selected as the gas to be previously adsorbed on the gas adsorptive surface protection sheet 313. A simple method for adsorbing a gas on the sheet 313 comprises previously exposing the gas adsorptive surface protection sheet to an atmosphere containing the gas to be adsorbed. The amount of the gas released by reeling off the gas adsorptive surface protection sheet may be appropriately controlled. When the amount of the released gas by reeling off the gas adsorptive surface protection sheet is too small, the effect of the present invention is not fully displayed as compared with conventional examples while, when the amount of the released gas is too large, the gas may adversely affect the deposition film. Accordingly, it is preferable to adsorb an appropriate amount of the gas on the gas adsorptive surface protection film.

For manufacturing a back reflector film to be used for a photovoltaic element, for example, a PET film coated with Al on one surface is preferable used as the gas adsorptive surface protection film, and a mixed gas containing moisture and air is preferable as the gas to be previously adsorbed. Preferable amount of the released gas from the gas adsorptive surface protection film is in the range of $1.3 \times 10^{-6}$ to $1.3 \times 10^{-1}$ Pa·l/s·cm².

For controlling the amount of the released gas, it is preferable to previously heat the surface protective sheet. Practically, it is preferable to treat the surface protective sheet in an oven heated at 100 to 150° C. for 8 to 24 hours, in order to remove excess gases adsorbed on the surface protective sheet.

No additional gas adsorption is required when the amount of the released gas is sufficiently controllable by the heat treatment as described above. Alternatively, gases are adsorbed on the sheet after the heat treatment. When a mixed gas containing moisture and air is adsorbed on the sheet, it is practically preferable to treat the surface protection sheet in a constant temperature space controlled at 10 to 30° C. with a relative humidity of 20 to 80% under a pressure of $0.9 \times 10^5$ to $1.1 \times 10^5$ Pa. A sheet that can provide a desired amount of released gas may be practically used by one or plural times of measurements of the amount of the released gas from the surface protection film under practically used gas release conditions, when the constant temperature space is difficult to use.

It is also possible to remove excess gases by placing the surface protective film in a reduced pressure space in place of the heat treatment as described above, or simultaneously with applying the heat treatment.

Figure 2:
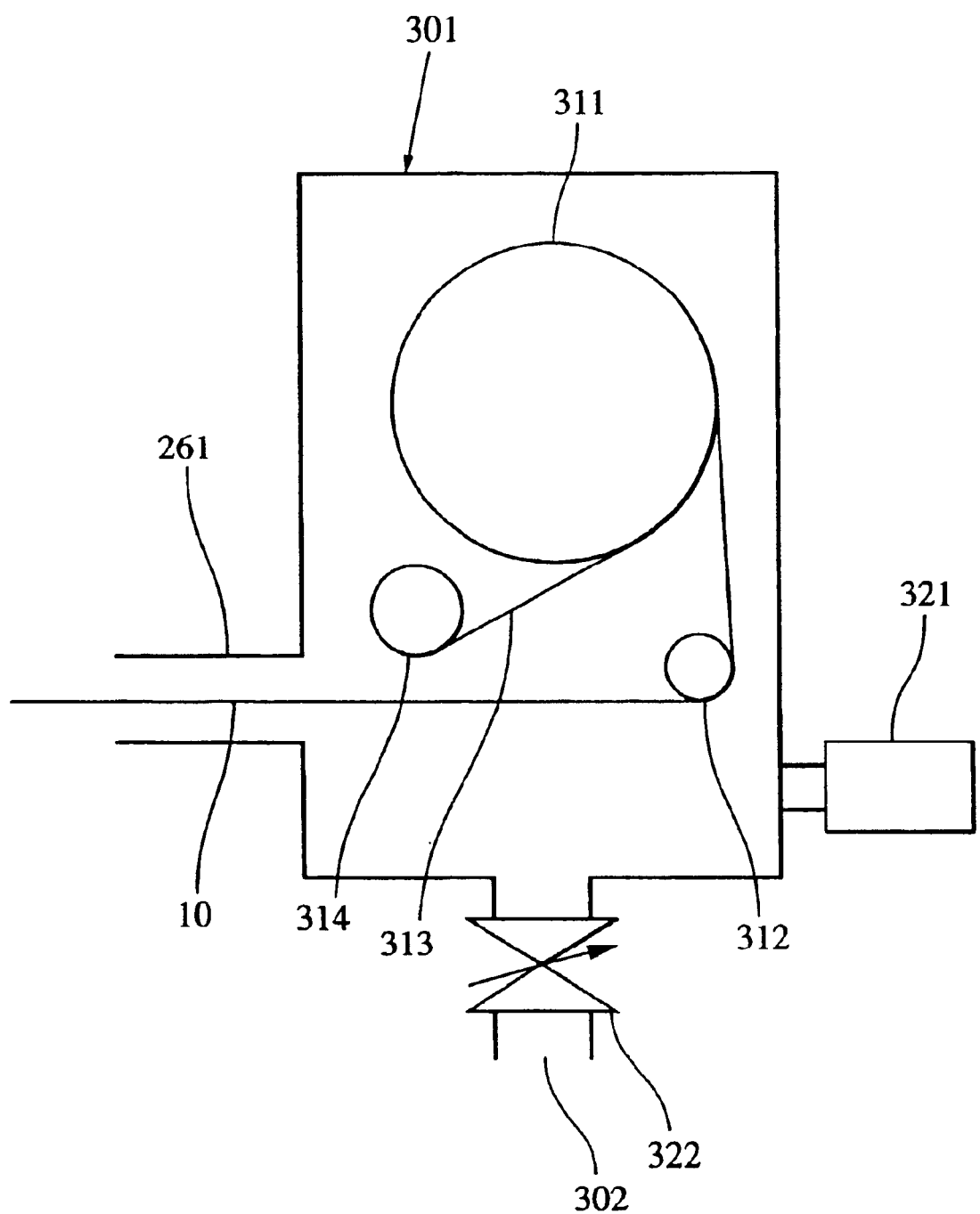
FIG. 2 is a cross section illustrating one example of the construction of a reel-up vacuum chamber of an apparatus for continuously forming the deposition film according to the present invention.

The construction of the apparatus as shown in FIG. 2 may be used, for example, for controlling the amount of the released gas component to be fed to the area for a treatment such as film deposition on the ribbon shaped substrate. FIG. 2 shows one example of a cross section of the reel-up vacuum chamber in the apparatus for forming a deposition film according to the present invention.

The reel-up vacuum chamber 301 is connected to the film deposition vacuum chamber (not shown) with a vacuum chamber connection member 261, and is evacuated with a vacuum pump (not shown) connected to the evacuation port 302. The ribbon shaped substrate 10 after the treatment is reeled up on the reel-up bobbin 311 by changing its convey direction with the convey roller 312. Then, the gas adsorptive surface protection sheet 313 is reeled off from the reel-off core 314 and is reeled up on the reel-up bobbin 311 together with the surface protection sheet. Evacuation conductance is adjusted with a butterfly valve 322 so that the pressure in the reel-up vacuum chamber 301 as measured with a pressure gauge 321 indicates a constant pressure. Since the pressure in the reel-up vacuum chamber 301 is controllable, the amount of the released gas from the sheet and the amount of the released gas components on the surface of the ribbon shaped substrate 10 in the vacuum chamber 301 may be also controlled. In a favorable example of the present invention, the pressure in the reel-up vacuum chamber 301 may be adjusted to be higher than the pressure in the film deposition vacuum chamber 201 when the released gas components are allowed to flow into the film deposition vacuum chamber 201, thereby enabling the amount of the released gas components flowing into the film deposition vacuum chamber from the reel-up vacuum chamber 301 to be constantly controlled.

In a different method, an analytical apparatus such as a Q-mass (a mass spectrometer) is connected to the reel-up vacuum chamber to measure the amount of the released gas components for controlling evacuation conductance from the results of measurements.

While the present invention is described with reference to the drawings, the present invention is by no means restricted to these examples. Other film deposition methods such as a CVD method and substrate treating methods such as etching may be applied in the present invention other than the sputtering method to be described hereinafter.

EXAMPLE 1

A lower electrode as a back reflector, and an Ag film and a ZnO film as light reflection films for the photovoltaic element were deposited using the apparatus in FIG. 1 according to the present invention.

SUS 430BA (120 mm in width×100 mm in length×0.13 mm in thickness) was used for the ribbon shaped substrate 10 and, after thorough degreasing and cleaning, tension of the substrate was adjusted so that no loosing remain by expanding as shown in FIG. 1.

Al was coated on one surface of a PET film to be used for the gas adsorptive surface protection sheet 313, and a mixed gas containing moisture and air is allowed to adsorb on the sheet after heat-treating it at 130° C. for 12 hours.

The film deposition vacuum chamber 201 was evacuated through the evacuation port 202 with a vacuum pump (not shown) to a reduced pressure of $5.3 \times 10^{-4}$ Pa. Then, Ar as a sputtering gas was introduced at a flow rate of 50 sccm into each film deposition chamber 204 and 206 heated with a lamp heater 203 at a film deposition temperature of 400° C., and a film deposition pressure of $2.7 \times 10^{-1}$ Pa was maintained by closing a main valve (not shown) to reduce conductance. Electric discharge was induced by externally applying a direct current voltage from a power source (not shown) on the Ag target 205 and ZnO target 207 to sequentially deposit the Ag film and ZnO film by sputtering on the ribbon shaped substrate 10. The substrate was reeled up on the reel-up bobbin 311 thereafter together with the gas adsorptive surface protection sheet 313, thereby completing the back reflector film.

The gas released from the gas adsorptive surface protection film 313 makes contact with the surface of the ZnO film in the reel-up vacuum chamber 301, and is introduced into the film deposition chamber 206 in the film deposition chamber 201 for use as a sputtering gas on the ZnO film. Several number of the gas adsorptive surface protection sheets containing different amounts of gases to be released were manufactured, and the back reflector films were manufactured using the sheets.

Comparative Example 1

Figure 3:
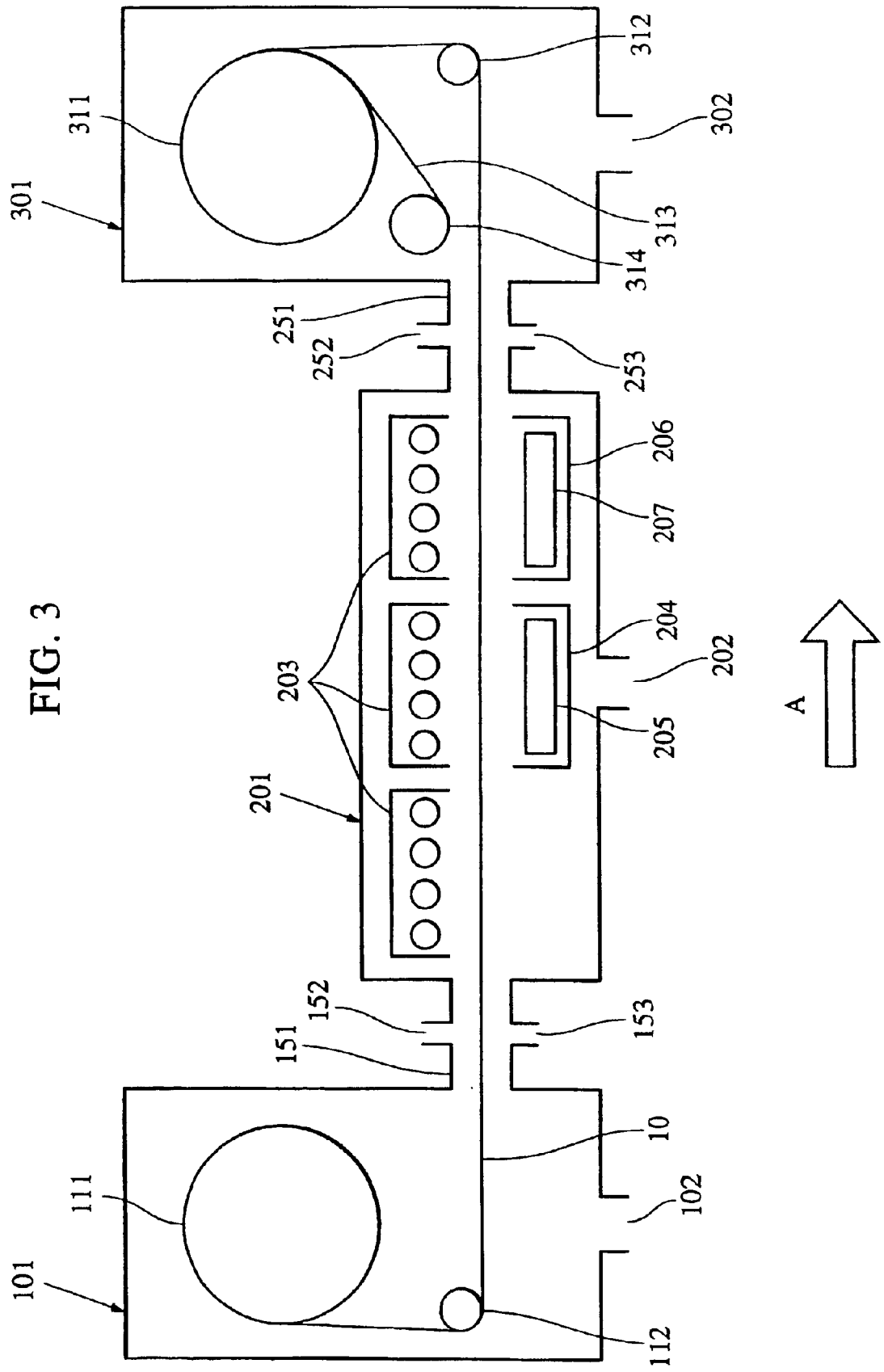
FIG. 3 is a cross section showing one example of an apparatus for continuously forming the deposition film according to the present invention.

The back reflector films were manufactured under the same condition as in Example 1 using an apparatus shown in FIG. 3. While a PET film coated with Al on one of the surface was used as the surface protection sheet, the sheet was subjected to neither previous gas adsorption nor heating.

(Result 1)

From the comparison of the of the back reflector film manufactured in Example 1 with the back reflector film manufactured in Comparative Example 1, it was found that the former film had a total reflectivity and scattering reflectivity of by 5.3% and 11.9% higher than those in the latter film, respectively. Further investigation revealed that this increase in reflectivity is due to enhanced transmittance of the ZnO film. These results may be ascribed to the effect of moisture or air alone, or the components of the mixed gas thereof, released from the gas adsorptive surface protection sheet. Although the mechanism has not been made clear yet, the gases are supposed to be incorporated into the ZnO film during or after deposition of the ZnO film.

The relation between the amount of the gases released from the gas adsorptive surface protection sheet and scattering reflectivity is shown in Table 1.

TABLE 1

| SURFACE PROTECTION SHEET | A | B | C | D | E | F |
|---|---|---|---|---|---|---|
| AMOUNT OF RELEASED GAS (Pa · L/s · cm²) | $2.7 \times 10^{-7}$ | $6.7 \times 10^{-6}$ | $1.1 \times 10^{-3}$ | $5.3 \times 10^{-2}$ | $6.7 \times 10^{-1}$ | $1.3 \times 10^{1}$ |
| SCATTERING REFLECTIVITY | Δ | ○ | ○ | ○ | Δ | x |

Reflectivity is represented by scattering reflectivity in Table 1 because the rate of change is largely reflected in scattering reflectivity. The mark "○" in the table denotes that scattering reflectivity is by 5% or more higher than that in Comparative Example 1, the mark "Δ" in the table denotes that scattering reflectivity is by 0 to 5% higher than that in Comparative Example 1, and the mark "x" in the table denotes that scattering reflectivity is less than that in Comparative Example 1.

Table 1 shows that the surface protection sheet with the amount of released gas of $1 \times 10^{-6}$ to $1 \times 10^{-1}$ Pa·l/s·cm² gives higher reflectivity. Poor reflectivity given by the protective sheet F is not related to transmittance of the ZnO film, but is ascribed to the change of the surface state to reduce scattering reflectivity.

EXAMPLE 2

The back reflectors for the photovoltaic element according using the Al film and ZnO film were manufactured using the apparatus in FIG. 1 according to the present invention.

The film deposition conditions were the same as in Example 1, except that the target material was changed from Ag to Al and the film deposition temperature was changed from 400° C. to 150° C.

Comparavtive Example 2

The back reflector was manufactured under the same condition as in Example 2 using the apparatus shown in FIG. 3. However, the surface protection sheet 313 was subjected to neither pre-heating nor gas adsorption.

(Result 2)

From the comparison of the back reflector film manufactured in Example 2 with the back reflector film manufactured in Comparative Example 2, it was found that the former film had a total reflectivity and scattering reflectivity of by 4.0% and 9.8% higher than those in the later film, respectively.

EXAMPLE 3

The back reflector films were manufactured using the apparatus shown in FIG. 2 according to the present invention, wherein the reel-up vacuum chamber 301 of the apparatus comprises a butterfly valve 322 for adjusting evacuation conductance so that the pressure in the reel-up vacuum chamber 301 as measured with a pressure gauge 321 becomes constant. Semiconductor elements were laminated on the back reflector film to manufacture a photovoltaic element.

The conditions for manufacturing the back reflector film were the same as used in Example 1, except that the film deposition pressure in the film deposition vacuum chamber was controlled at $2.7 \times 10^{-1}$ Pa and the pressure in the reel-up vacuum chamber was controlled at $5.3 \times 10^{-1}$ Pa.

The ribbon shaped substrate on which the back reflector film obtained by the foregoing method using the apparatus according to the present invention was deposited was taken out of the roll-to-roll apparatus. The substrate was cut into 5 cm×5 cm pieces, which were set in a single chamber type vacuum CVD apparatus. Then, a n-type amorphous silicon film, an i-type amorphous silicon film and a p-type amorphous silicon film were sequentially deposited on the piece of substrate in this order by the CVD method under the conditions as shown in Table 2.

TABLE 2

| THICKNESS OF DEPOSITION FILM (mm) | GAS FLOW RATE (sccm) | PRESSURE (Pa) | DISCHARGE POWER (W) | HEATING TEMPERATURE (° C.) |
|---|---|---|---|---|
| n-TYPE SEMICONDUCTOR LAYER (20) | $SiH_4$: 150<br>$PH_3$: 3<br>$H_2$: 1500 | 133 | RF (150) | 350 |
| i-TYPE SEMICONDUCTOR LAYER (400) | $SiH_4$: 60<br>$H_2$: 200 | 1.33 | MICROWAVE (200) | 300 |
| p-TYPE SEMICONDUCTOR LAYER (20) | $SiH_4$: 5<br>1% $BF_3$: 1<br>$H_2$: 2000 | 133 | RF (700) | 250 |

Figure 4:
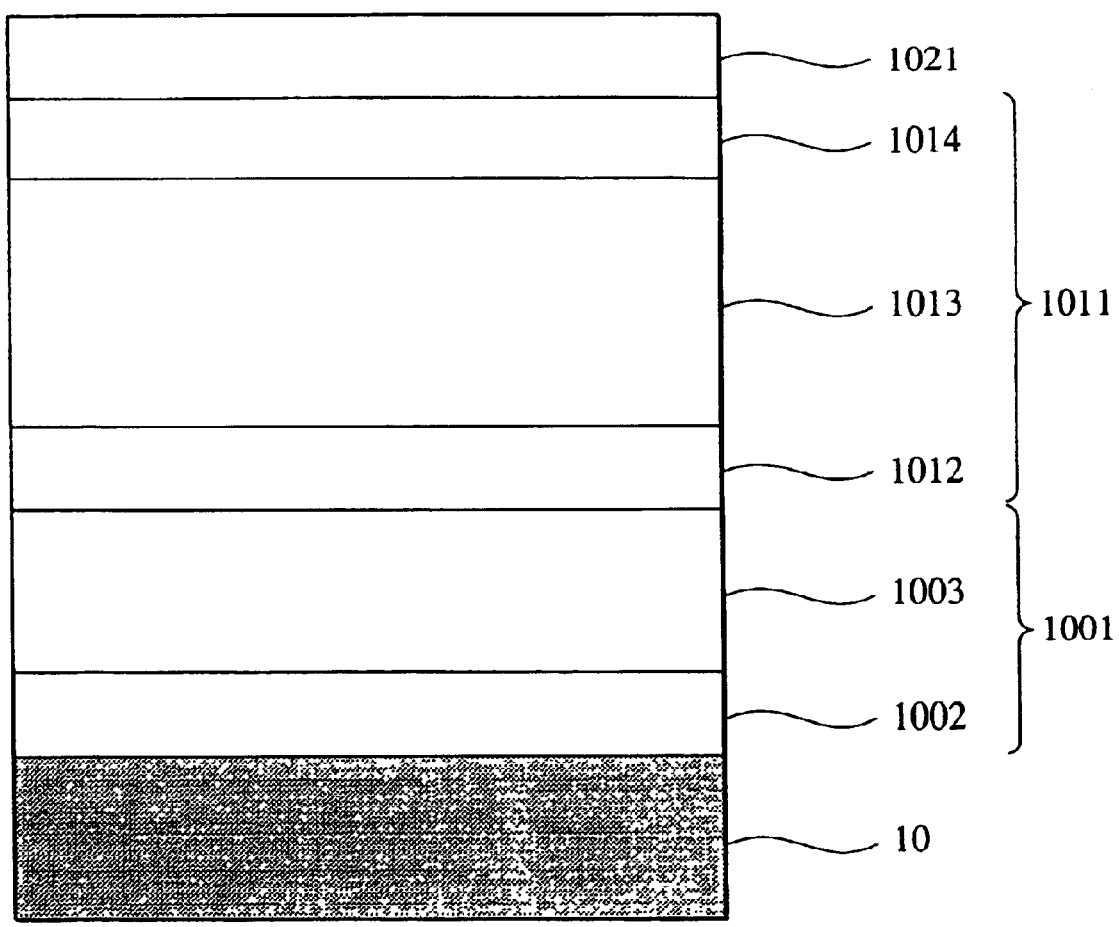
FIG. 4 is a cross section illustrating a photovoltaic element manufactured in Example 3.

Then, the substrate was set in the single chamber type vacuum deposition apparatus, and a ITO transparent conductive film was deposited by the vacuum deposition method under the conditions as shown in Table 3 to manufacture a photovoltaic element having a cross section shown in FIG. 4.

TABLE 3

| VACUUM DEPOSITION SOURCE (COMPOSITION RATIO) | VACUUM DEPOSITION ATMOSPHERE (Pa) | HEATING TEMPERATURE OF SUBSTRATE (° C.) | VACUUM DEPOSITION RATE (nm/sec) | THICKNESS OF DEPOSITION FILM (mm) |
|---|---|---|---|---|
| In—Sn ALLOY (50:50) | $O_2$: $3 \times 10^{-2}$ | 180 | 0.7 | 80 |

In FIG. 4, the reference numeral 10 denotes the substrate, the reference numeral 1001 denotes the back reflector film, the reference numeral 1002 denotes the Ag film, the reference numeral 1003 denotes the ZnO film, the reference numeral 1011 denotes semiconductor elements in which the reference numerals 1012, 1013 and 1014 denote n-type amorphous silicon, i-type amorphous silicon and p-type amorphous silicon, respectively, and the reference numeral 1021 denotes the ITO transparent conductive film.

Comparative Example 3

A photovoltaic element was manufactured by laminating the back reflector film and semiconductor elements under the same condition as in Example 3 using the apparatus as shown in FIG. 3. However, the surface protection sheet 313 was subjected to neither pre-heating nor gas adsorption.
(Result 3)

From the comparison of the properties of the photovoltaic element manufactured in Example 3 with the photovoltaic element manufactured in Comparative Example 3, it was found that the former element had a short circuit current of by 4.0% higher than that in the latter element.

EXAMPLE 4

Figure 5:
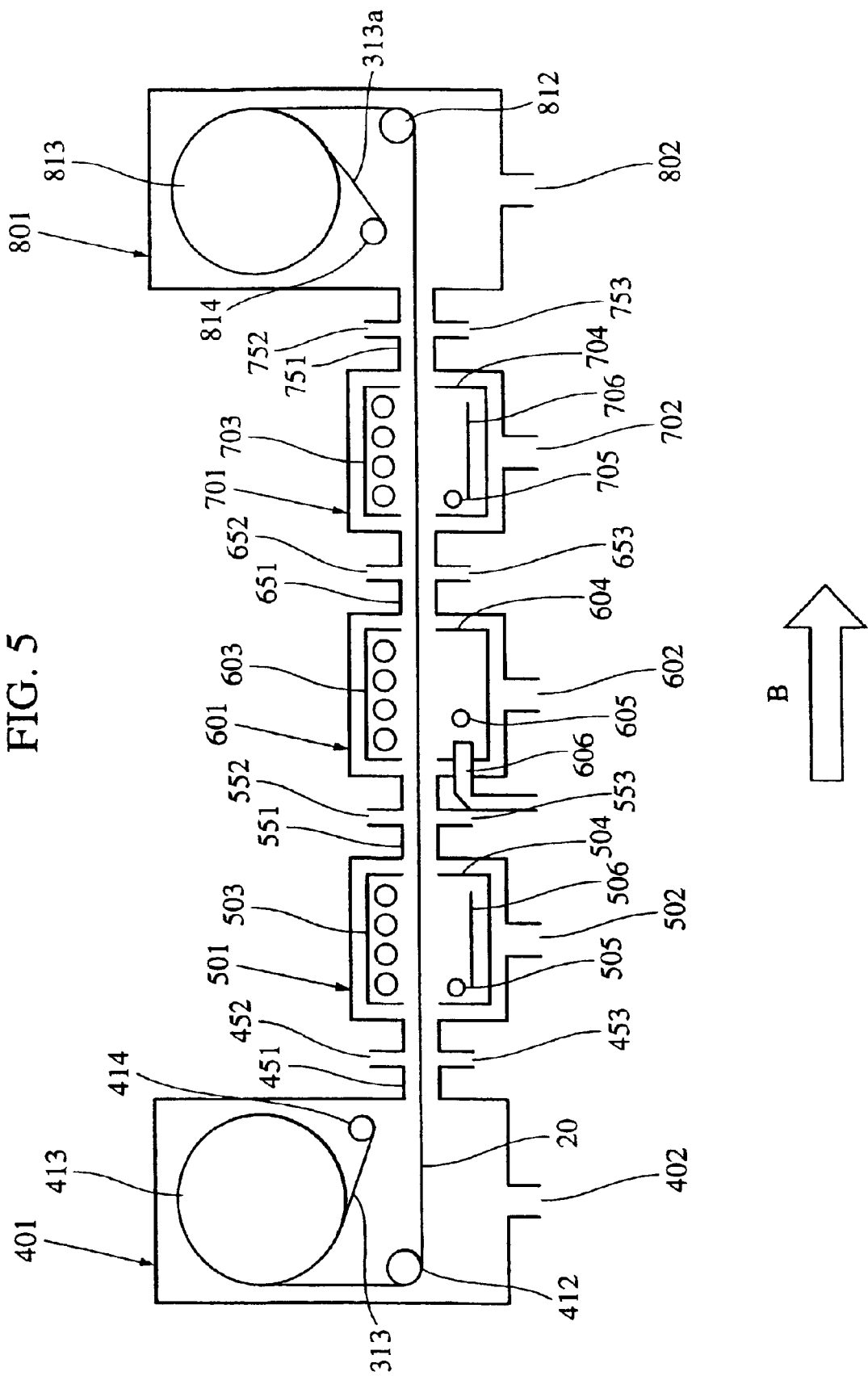
FIG. 5 is a cross section illustrating a roll-to-roll type CVD device.

A photovoltaic element was manufactured using the back reflector film manufactured by using the apparatus in FIG. 1 according to the present invention, followed by laminating the semiconductor elements thereon using the apparatus shown in FIG. 5.

The back reflector film was manufactured under the same condition as in Example 1 using the apparatus shown in FIG. 1.

Then, the ribbon shaped substrate on which the back reflector film had been laminated was taken out of the apparatus shown in FIG. 1, and mounted on the apparatus shown in FIG. 5. FIG. 5 shows a roll-to-roll CVD apparatus.

The reel-off vacuum chamber 401, n-type semiconductor deposition vacuum chamber 501, i-type semiconductor deposition vacuum chamber 601, p-type semiconductor deposition vacuum chamber 701 and reel-up vacuum chamber 801 are connected with gas gates 451, 551, 651 and 751 to one another, respectively, and are evacuated through evacuation ports 402, 502, 602, 702 and 802, respectively, with vacuum pumps (not shown).

The ribbon shaped substrate 20 on which the back reflector film is laminated and wound on the reel-off bobbin 413 is reeled off together with the surface protection sheet 313, and is conveyer toward the n-type semiconductor deposition vacuum chamber 501, i-type semiconductor deposition vacuum chamber 601 and p-type semiconductor deposition vacuum chamber 701 with its convey direction changed with a convey roller 412 (the direction shown by an arrow B). The surface protection sheet 313 is reeled up on a reel-up core 414. The ribbon shaped substrate 20 subjected to a treatment such as film deposition in each vacuum chamber is reeled up on the reel-up bobbin 813 with its convey direction changed with the convey roller 812 together with the surface protection sheet 313a (made of the same material as the sheet 313) reeled off from the reel-off core 814. A sweeping gas flows through sweep gas feed pipes 452, 453, 552, 553, 652, 653, 752 and 753 at the gas gates 451, 551, 651 and 751 in order to prevent the gases from being mixed between respective vacuum chambers.

Subsequently, the film deposition vacuum chambers are heated at a prescribed temperature with respective lamp heaters 503, 603 and 703. Then, a film deposition gas is introduced through film deposition gas introduction ports 505, 605 and 705, and $H_2$ gas as a sweep gas is introduced through sweep gas feed pipes 452, 453, 552, 553, 652, 653, 752 and 753. A RF voltage at 13.5 MHz is applied on the discharge electrodes 506 and 706 while introducing a microwave at 2.45 GHz from microwave introduction device 606 to induce grow discharge in respective discharge furnaces 504, 604 and 704, thereby depositing each layer by the CVD method. The film deposition conditions for each layer are shown in Table 4.

TABLE 4

| FILM DEPOSITION CHAMBER | THICKNESS OF DEPOSITION FILM (nm) | GAS FLOW RATE (sccm) | PRESSURE (Pa) | DISCHARGE POWER (W) | HEATING TEMPERATURE (° C.) |
|---|---|---|---|---|---|
| 501 | n-TYPE SEMI-CONDUCTOR (20) | $SiH_4$: 150 $PH_3$: 3 $H_2$: 1500 | 133 | RF (150) | 350 |
| 601 | i-TYPE SEMI-CONDUCTOR (400) | $SiH_4$: 60 $H_2$: 200 | 1.33 | MICROWAVE (200) | 300 |
| 701 | p-TYPE SEMI-CONDUCTOR (20) | $SiH_4$: 5 1% $BF_3$: 1 $H_2$: 2000 | 133 | RF (700) | 250 |

The ribbon shaped substrate 20 on which the amorphous silicon films obtained by the method above using the instrument according to the present invention was taken out of the roll-to-roll apparatus, and cut into 5 cm×5 cm pieces. An ITO transparent conductive film was deposited on the piece of the substrate by the same method as in Example 3 to manufacture a photovoltaic element having a cross section shown in FIG. 4.

Comparative Example

A photovoltaic element comprising laminated semiconductor elements was manufactured by the same method as in example 4, except that the back reflector film and semiconductor elements were laminated by the same method as in Comparative example 1.

(Result 4)

From the comparison of the properties of the photovoltaic element manufactured in Example 4 with the photovoltaic element manufactured in Comparative Example 4, it was found that the former element had a short circuit current of by 4.0% higher than that in the latter element.

According to the present invention as hitherto described, continuous feed of the adsorption gas components from the gas adsorptive member on which gases are previously adsorbed into the vacuum chamber can be favorably controlled to enable high quality deposition films to be deposited on the substrate.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structured and functions.

What is claimed is:

1. A method for forming a deposition film on a substrate in a film deposition chamber, wherein a gas adsorptive member is placed in a space communicating with the film deposition chamber, the deposition film being deposited while continuously feeding a released gas component generated from the member into the space.

2. A method for forming a deposition film according to claim 1, wherein the released gas component is fed by reeling off the gas adsorptive member.

* * * * *